(12) United States Patent
Steiner et al.

(10) Patent No.: US 9,136,876 B1
(45) Date of Patent: Sep. 15, 2015

(54) SIZE LIMITED MULTI-DIMENSIONAL DECODING

(71) Applicant: DensBits Technologies Ltd., Haifa (IL)

(72) Inventors: Avi Steiner, Kiryat Motzkin (IL); Hanan Weingarten, Hertzelia (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 177 days.

(21) Appl. No.: 13/917,069

(22) Filed: Jun. 13, 2013

(51) Int. Cl.
*H03M 13/00* (2006.01)
*H03M 13/11* (2006.01)
*H03M 13/29* (2006.01)

(52) U.S. Cl.
CPC ...... *H03M 13/1111* (2013.01); *H03M 13/2918* (2013.01); *H03M 13/2927* (2013.01); *H03M 13/2963* (2013.01)

(58) Field of Classification Search
CPC .......... H03M 13/451; H03M 13/1111; H03M 13/2918; H03M 13/2927; H03M 13/2963
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,592,641 A | 1/1997 | Doyle et al. | |
| 5,623,620 A | 4/1997 | Alexis et al. | |
| 5,640,529 A | 6/1997 | Hasbun | |
| 5,657,332 A | 8/1997 | Auclair et al. | |
| 5,663,901 A | 9/1997 | Harari et al. | |
| 5,724,538 A | 3/1998 | Morris et al. | |
| 5,729,490 A | 3/1998 | Calligaro et al. | |
| 5,740,395 A | 4/1998 | Wells et al. | |
| 5,745,418 A | 4/1998 | Hu et al. | |

(Continued)

OTHER PUBLICATIONS

Search Report of PCT Patent Application WO 2009/118720 A3, Mar. 4, 2010.

(Continued)

*Primary Examiner* — Sam Rizk
(74) *Attorney, Agent, or Firm* — Dentons US LLP

(57) ABSTRACT

A system, computer readable medium and a method for multi-dimensional decoding. The method may include calculating, for each single code component of multiple code components and for each dimension of the multi-dimensional decoding, multiple first candidates and assigning a first reliability score for each first candidate; selecting, for each single code component and for each dimension, a second candidate out of the multiple first candidates in response to first reliability scores of the multiple first candidates; selecting, per dimension, multiple third candidates out of all second candidates associated with the dimension, in response to reliability information related to the second candidates associated with the dimension; selecting fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

22 Claims, 11 Drawing Sheets

(56) References Cited

U.S. PATENT DOCUMENTS

| | | | |
|---|---|---|---|
| 5,778,430 A | 7/1998 | Ish et al. |
| 5,793,774 A | 8/1998 | Usui et al. |
| 5,920,578 A | 7/1999 | Zook |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,307,901 B1 | 10/2001 | Yu et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,746,951 B2 * | 6/2010 | Hwang et al. ............. 375/267 |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,120,960 B2 | 2/2012 | Varkony |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,276,051 B2 | 9/2012 | Weingarten et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,341,502 B2 | 12/2012 | Steiner et al. |
| 8,407,560 B2 | 3/2013 | Ordentlich et al. |
| 8,417,893 B2 | 4/2013 | Khmelnitsky et al. |
| 8,453,022 B2 | 5/2013 | Katz |
| 8,467,249 B2 | 6/2013 | Katz et al. |
| 8,468,431 B2 | 6/2013 | Steiner et al. |
| 8,510,639 B2 | 8/2013 | Steiner et al. |
| 8,621,321 B2 | 12/2013 | Steiner et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0126549 A1 | 7/2003 | Seki |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |

(56) References Cited

U.S. PATENT DOCUMENTS

| | | |
|---|---|---|
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0256417 A1 | 10/2008 | Andersson |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1* | 9/2011 | Steiner et al. .................. 714/746 |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |

(56) References Cited

U.S. PATENT DOCUMENTS

| | | | |
|---|---|---|---|
| 2012/0051144 | A1 | 3/2012 | Weingarten et al. |
| 2012/0063227 | A1 | 3/2012 | Weingarten et al. |
| 2012/0066441 | A1 | 3/2012 | Weingarten |
| 2012/0110250 | A1 | 5/2012 | Sabbag et al. |
| 2012/0124273 | A1 | 5/2012 | Goss et al. |
| 2012/0246391 | A1 | 9/2012 | Meir et al. |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, p. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI—Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic, Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

1100

SIZE LIMITED MULTI-DIMENSIONAL DECODING

BACKGROUND OF THE INVENTION

Multi-dimensional codes are widely used due to their potential efficiency. It is usually impractical to implement optimal decoding in the sense of maximal probability per information bit, such as maximum likelihood (ML) decoding, since the complexity may grow rapidly.

There is a need to reduce the complexity of multi-dimensional codes while benefiting from increased decoding efficiency at a low complexity.

SUMMARY

A method, a system and a non-transitory computer readable medium are provided for size limited multi-dimensional decoding.

According to an embodiment of the invention a method may be provided for multi-dimensional decoding, the method may include calculating, for each single code component of multiple code components and for each dimension of the multi-dimensional decoding, multiple first candidates and assigning a first reliability score for each first candidate; selecting, for each single code component and for each dimension, a second candidate out of the multiple first candidates in response to first reliability scores of the multiple first candidates; selecting, per dimension, multiple third candidates out of all second candidates associated with the dimension, in response to reliability information related to the second candidates associated with the dimension; selecting fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

The method may include selecting each second candidate as a most reliable first candidate out of the multiple first candidates.

The selecting of the multiple third candidates may be responsive to reliability information related to second candidates associated with the dimension and to second most reliable first candidates.

The selecting may be responsive to a difference between reliability levels of most reliable and second most reliable second candidates and reliability levels of second most reliable first candidates that are associated with the second candidates.

The method selecting of the fourth candidates may include evaluating multiple combinations of third candidates and rejecting at least one combination of third candidates.

The method may include evaluating a combination of third candidates of a certain dimension by initializing a next dimension decoding by a certain decoder state obtained by applying the combination of the third candidates of the certain dimension.

The method may include selecting the multiple third candidates in response to the reliability information related to the second candidates associated with the dimension and in response to third candidates number constraint.

The method may include selecting the fourth candidates in response to reliability scores of the third candidates.

The method may include selecting the fourth candidates in response to reliability scores of the third candidates and in response to reliability scores of second candidates associated with the third candidates.

The method may include selecting the fourth candidates in response to reliability information related to the third candidates and in response to fourth candidate number limitation.

The method may include determining that the applying of the multi-dimensional soft decoding process failed; changing at least one number limitations related to at least one of the first, second, third and fourth candidates and repeating the stages of calculating multiple first candidates, selecting a second candidate for each single code component and for each dimension, selecting, per dimension, multiple third candidates, selecting fourth candidates and applying the multi-dimensional soft decoding process.

The method may include altering reliability scores related to a selected candidate out of the first, second, third and fourth candidates, after selecting the selected candidate to reflect the selecting of the selected candidate.

The method altering may include changing a value of reliability score by changing an absolute value of the reliability score without changing a sign of the reliability score.

The method may include changing a value of reliability score by changing a sign of the reliability score.

The method may include altering reliability scores related to the selected candidate in response to values of the reliability scores of the selected candidate prior to the altering.

The method may include resetting reliability scores related to the selected candidate.

The method may include rejecting candidates out of the first, second and third candidates by comparing the candidates to thresholds; wherein the method may include altering the thresholds.

According to an embodiment of the invention there may be provided a method for multi-dimensional decoding, the method may include (A) selecting candidates for soft multi-dimensional decoding of multiple code components to provide selected candidates by performing multiple iterations of a process that may include: calculating reliability information associated with a current set of candidates; selecting out of the set of candidates a next set of candidates in response to the reliability information associated to the current set of candidates and candidate number constraint; and defining the next set of candidates as the current set of candidates; and (B) applying a multi-dimensional decoding process on the current components.

The reliability information of at least one current set of candidates may include most reliable previous set candidates and second most reliable previous set candidates.

The method may include evaluating changes in values of bits located at the locations indicated by the fourth candidates.

The method may include performing of the multiple iterations of the process may include executing at least two of the following stages: selecting, for each single code component and for each dimension, a second candidate out of the multiple first candidates in response to first reliability scores of the multiple first candidates; selecting, per dimension, multiple third candidates out of all second candidates associated with the dimension, in response to reliability information related to the second candidates associated with the dimension; selecting fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

According to an embodiment of the invention there may be provided a non-transitory computer readable medium that includes instructions to be executed by a computerized system and may store instructions for: calculating, for each single code component of multiple code components and for each dimension of the multi-dimensional decoding, multiple first candidates and assigning a first reliability score for each first candidate; selecting, for each single code component and for each dimension, a second candidate out of the multiple first candidates in response to first reliability scores of the multiple first candidates; selecting, per dimension, multiple third candidates out of all second candidates associated with the dimension, in response to reliability information related to the second candidates associated with the dimension; selecting fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

The non-transitory computer readable medium may store instructions for selecting each second candidate as a most reliable first candidate out of the multiple first candidates.

The selecting of the multiple third candidates may be responsive to reliability information related to second candidates associated with the dimension and to second most reliable first candidates.

The selecting may be responsive to a difference between reliability levels of most reliable and second most reliable second candidates and reliability levels of second most reliable first candidates that are associated with the second candidates.

The method selecting of the fourth candidates may include evaluating multiple combinations of third candidates and rejecting at least one combination of third candidates.

The non-transitory computer readable medium may store instructions for evaluating a combination of third candidates of a certain dimension by initializing a next dimension decoding by a certain decoder state obtained by applying the combination of the third candidates of the certain dimension.

The non-transitory computer readable medium may store instructions for selecting the multiple third candidates in response to the reliability information related to the second candidates associated with the dimension and in response to third candidates number constraint.

The non-transitory computer readable medium may store instructions for selecting the fourth candidates in response to reliability scores of the third candidates.

The non-transitory computer readable medium may store instructions for selecting the fourth candidates in response to reliability scores of the third candidates and in response to reliability scores of second candidates associated with the third candidates.

The non-transitory computer readable medium may store instructions for selecting the fourth candidates in response to reliability information related to the third candidates and in response to fourth candidate number limitation.

The non-transitory computer readable medium may store instructions for determining that the applying of the multi-dimensional soft decoding process failed; changing at least one number limitations related to at least one of the first, second, third and fourth candidates and repeating the stages of calculating multiple first candidates, selecting a second candidate for each single code component and for each dimension, selecting, per dimension, multiple third candidates, selecting fourth candidates and applying the multi-dimensional soft decoding process.

The non-transitory computer readable medium may store instructions for altering reliability scores related to a selected candidate out of the first, second, third and fourth candidates, after selecting the selected candidate to reflect the selecting of the selected candidate.

The non-transitory computer readable medium may store instructions for changing a value of reliability score by changing an absolute value of the reliability score without changing a sign of the reliability score.

The non-transitory computer readable medium may store instructions for changing a value of reliability score by changing a sign of the reliability score.

The non-transitory computer readable medium may store instructions for altering reliability scores related to the selected candidate in response to values of the reliability scores of the selected candidate prior to the altering.

The non-transitory computer readable medium may store instructions for resetting reliability scores related to the selected candidate.

The non-transitory computer readable medium may store instructions for rejecting candidates out of the first, second and third candidates by comparing the candidates to thresholds; wherein the non-transitory computer readable medium may store instructions for altering the thresholds.

According to an embodiment of the invention there may be provided a non-transitory computer readable medium that may store instructions for (A) selecting candidates for soft multi-dimensional decoding of multiple code components to provide selected candidates by performing multiple iterations of a process that may include: calculating reliability information associated with a current set of candidates; selecting out of the set of candidates a next set of candidates in response to the reliability information associated to the current set of candidates and candidate number constraint; and defining the next set of candidates as the current set of candidates; and (B) applying a multi-dimensional decoding process on the current components.

The reliability information of at least one current set of candidates may include most reliable previous set candidates and second most reliable previous set candidates.

The non-transitory computer readable medium may store instructions for evaluating changes in values of bits located at the locations indicated by the fourth candidates.

The non-transitory computer readable medium may store instructions for performing of the multiple iterations of the process may include executing at least two of the following stages: selecting, for each single code component and for each dimension, a second candidate out of the multiple first candidates in response to first reliability scores of the multiple first candidates; selecting, per dimension, multiple third candidates out of all second candidates associated with the dimension, in response to reliability information related to the second candidates associated with the dimension; selecting fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

According to an embodiment of the invention there may be provided a system that may include a memory controller that may be arranged to calculate, for each single code component of multiple code components and for each dimension of the multi-dimensional decoding, multiple first candidates and assigning a first reliability score for each first candidate; select, for each single code component and for each dimension, a second candidate out of the multiple first candidates in response to first reliability scores of the multiple first candidates; select, per dimension, multiple third candidates out of all second candidates associated with the dimension, in response to reliability information related to the second candidates associated with the dimension; select fourth candidates out of third candidates of all dimensions; wherein a number of the fourth candidates is smaller than a number of the third candidates of all dimensions; wherein the fourth candidates are indicative of locations of bits to be evaluated; and apply a multi-dimensional soft decoding process on the multiple code components.

The memory controller may be arranged to select each second candidate as a most reliable first candidate out of the multiple first candidates.

The selection of the multiple third candidates may be responsive to reliability information related to second candidates associated with the dimension and to second most reliable first candidates.

The selection may be responsive to a difference between reliability levels of most reliable and second most reliable second candidates and reliability levels of second most reliable first candidates that are associated with the second candidates.

The memory controller may be arranged to evaluate multiple combinations of third candidates and rejecting at least one combination of third candidates.

The memory controller may be arranged to evaluate a combination of third candidates of a certain dimension by initializing a next dimension decoding by a certain decoder state obtained by applying the combination of the third candidates of the certain dimension.

The memory controller may be arranged to select the multiple third candidates in response to the reliability information related to the second candidates associated with the dimension and in response to third candidates number constraint.

The memory controller may be arranged to select the fourth candidates in response to reliability scores of the third candidates.

The memory controller may be arranged to select the fourth candidates in response to reliability scores of the third candidates and in response to reliability scores of second candidates associated with the third candidates.

The memory controller may be arranged to select the fourth candidates in response to reliability information related to the third candidates and in response to fourth candidate number limitation.

The memory controller may be arranged to determine that the applying of the multi-dimensional soft decoding process failed; change at least one number limitations related to at least one of the first, second, third and fourth candidates and repeating the stages of calculating multiple first candidates, select a second candidate for each single code component and for each dimension, select, per dimension, multiple third candidates, select fourth candidates and applying the multi-dimensional soft decoding process.

The memory controller may be arranged to alter reliability scores related to a selected candidate out of the first, second, third and fourth candidates, after select the selected candidate to reflect the select of the selected candidate.

The memory controller may be arranged to change a value of reliability score by changing an absolute value of the reliability score without changing a sign of the reliability score.

The memory controller may be arranged to change a value of reliability score by changing a sign of the reliability score.

The memory controller may be arranged to alter reliability scores related to the selected candidate in response to values of the reliability scores of the selected candidate prior to the altering.

The memory controller may be arranged to reset reliability scores related to the selected candidate.

The memory controller may be arranged to reject candidates out of the first, second and third candidates by comparing the candidates to thresholds; wherein the memory controller may be arranged to altering the thresholds.

According to an embodiment of the invention there may be provided a non-transitory computer readable medium that may store instructions for (A) select candidates for soft multi-dimensional decoding of multiple code components to provide selected candidates by performing multiple iterations of a process that may include: calculating reliability information associated with a current set of candidates; select out of the set of candidates a next set of candidates in response to the reliability information associated to the current set of candidates and candidate number constraint; and defining the next set of candidates as the current set of candidates; and (B) applying a multi-dimensional decoding process on the current components.

The reliability information of at least one current set of candidates may include most reliable previous set candidates and second most reliable previous set candidates.

The memory controller may be arranged to evaluate changes in values of bits located at the locations indicated by the fourth candidates.

The memory controller may be arranged to performing of the multiple iterations of the process may include executing at least two of the following stages: select, for each single code component and for each dimension, a second candidate out of the multiple first candidates in response to first reliability scores of the multiple first candidates; select, per dimension, multiple third candidates out of all second candidates associated with the dimension, in response to reliability information related to the second candidates associated with the dimension; select fourth candidates out of third candidates of all dimensions; wherein a number of the fourth candidates is smaller than a number of the third candidates of all dimensions; wherein the fourth candidates are indicative of locations of bits to be evaluated; and applying a multi-dimensional soft decoding process on the multiple code components.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
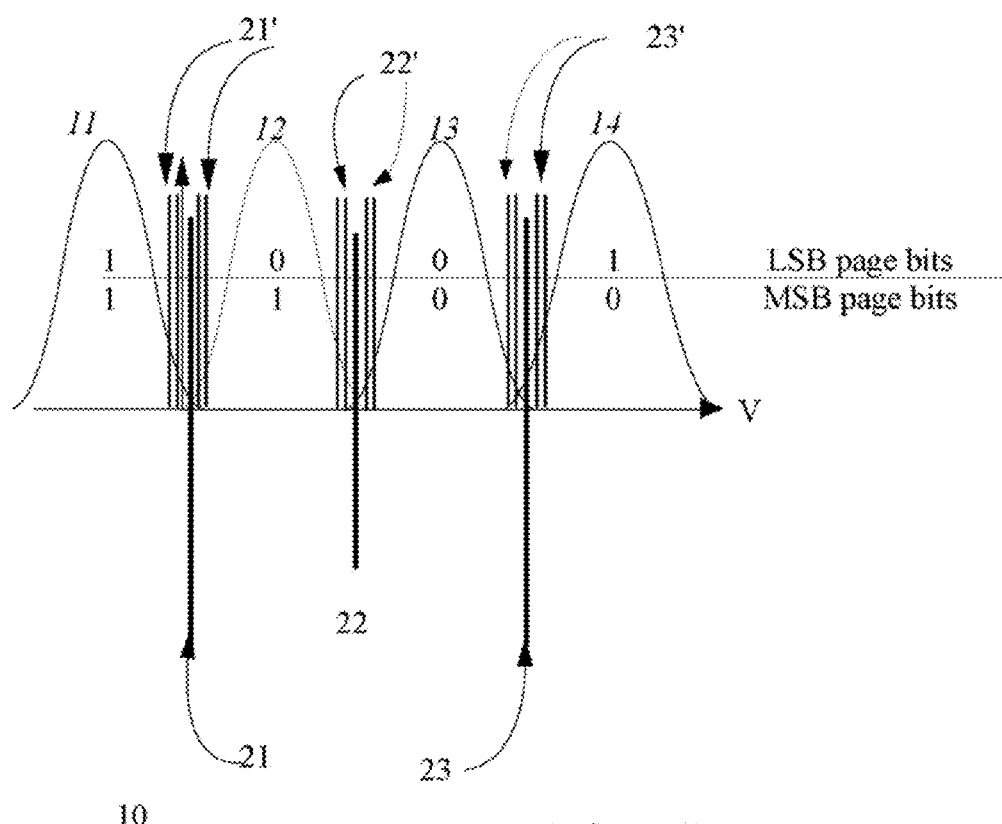
FIG. 1 illustrates a prior art voltage threshold distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Soft decoding of multi-dimensional codes includes methods for approximating optimal maximum likelihood decoding via sub-optimal algorithms with relatively low complexity.

An example of multi-dimensional codes is provided in U.S. Pat. No. 8,341,502 titled "SYSTEM AND METHOD FOR MULTI-DIMENSIONAL DECODING" which is incorporated herein by reference There are provided method for soft decoding of multi-dimensional codes, where the main benefits are increased decoding efficiency at a low complexity. The method can address the problem of non-negligible false correction probability for decoding a BCH component code. In a multi-dimensional code constructed with multiple BCH component codes, usually each BCH component may be capable of correcting only a few errors. In such cases, the code components have weak misscorrection detection, and thus may arrive at false corrections. To mitigate this problem in soft decoding the decoder observes for example the sum-LLR of a suggested correction, and takes only the solutions which are more likely. However, this does not guarantee that there are no false corrections taken during an iterative decoding process.

In order to maximize the probability of successful decoding, even in presence of false corrections, it is suggested here to create a list of accepted solutions, and apply the decoding process on this list. Since the decoding here is an iterative decoding which operates per dimension, a list may exponentially grow per dimension/iteration. Therefore the list size is kept fixed after every dimension decoding, by ranking the many potential candidates according to their likelihood score, and selecting a fixed number of the most likely candidates obtained during the last iteration.

The following describes the details of the list decoding methods for the multi-dimensional codes.

FIG. 1 demonstrates a voltage threshold distribution 10 of a multi-level cell (MLC) flash memory that include lobes 11-14. The most significant bit (MSB) page type can read with a single threshold 22 when the number of errors is sufficiently low. Otherwise, if the error correction coding (ECC) cannot correct the errors using a single read, a digital signal processing (DSP) unit may perform multiple reads to obtain soft information at the decoder input. The soft information may be obtained by reading for example at the designated thresholds 22' around the hard input threshold 22. From the multiple reads the soft information may be computed, in the form of log-likelihood ratio (LLR). For reading the least significant bits (LSB) stored on same row, the decoder reads using two thresholds 21 and 23, defined as LSB page hard thresholds in FIG. 1.

If hard decoding cannot be successfully completed due to high error rate, the decoder may be provided by soft information obtained from multiple reads in a similar form as described for the MSB pages (using read thresholds 21' and 23' near read thresholds 21 and 23 respectively).

Soft decoding relates to the decoding using soft input information, and providing hard output associated with the corrected information bits.

For soft decoding of a BCH component code (also termed as packet) soft information per bit is required. This is obtained by performing multiple reads from the flash memory module, where each read operation uses different read thresholds. The read thresholds must be configured such that soft metrics, called LLR, can be computed per bit. The definition of an LLR is $$LLR(b_i) = \log\left(\frac{P(b_i = 1)}{P(b_i = 0)}\right) \quad (1)$$

Where $b_i$ is the i-th bit of some codeword. The LLR expression can be substantially simplified, for an additive white Gaussian noise (AWGN) channel model. The AWGN is also a good approximation in many cases for the Flash voltage threshold distribution. By assuming an AWGN channel, $$P(b_i \mid y) = \frac{1}{\sqrt{2\pi\sigma^2}} \exp\left(-\frac{(y-b_i)^2}{2\sigma^2}\right) \quad (2)$$

Where y is the AWGN channel output. It is straightforward to show that the $LLR(b_i)$ becomes $$LLR(b_i) = \frac{2y}{\sigma^2} \quad (3)$$

Where the LLR per bit is created during the multiple Flash reads, as a quantized version of an AWGN channel. The quantization level per threshold is directly determined by the number of reads, as the base-two logarithm of the read counter. Once, the multiple reads have been performed, and LLRs are available for all codeword bits, the decoding process may begin.

According to an embodiment of the invention there is provided a method, system and computer readable medium capable of selecting valid solutions out of a greater number of solutions (candidates). There are provided several methods for providing a score per suggested solution, and then ranking the solutions according to score, and keeping only the solutions that the score condition is met in comparison to a threshold. Alternatively, the solutions that are kept are the N most likely solutions according to the score results.

According to an embodiment of the invention there is provided a method, system and computer readable medium capable of forming a list (or another size limited group of candidates) from a dimension decoding operation—several methods for forming a list of decoder states after completing a soft decoding operation per component of a certain dimension are suggested. This includes selection of the most likely solutions and forming a list by assuming various hypotheses on false corrections, or in other words forming different combinations of the solutions suggested earlier by rejecting valid solutions via the assumption of false correction.

According to an embodiment of the invention there is provided a method, system and computer readable medium capable of reducing the number of candidates (list size) to maintain a linear complexity for decoding.

According to an embodiment of the invention there is provided a method, system and computer readable medium capable of adaptive sum-LLR threshold setting, for efficient soft decoding.

According to an embodiment of the invention there is provided a method, system and computer readable medium capable of clipping LLR values—the clipping value associated with a correction may change with respect to the score.

According to an embodiment of the invention there is provided a method, system and computer readable medium capable of performing a clipping reset operation—from a certain iteration, if decoder did not succeed yet, the LLR absolute values can be set back to their original absolute values, while keeping their sign unchanged. This enables the decoder to more easily recover from a false correction.

According to an embodiment of the invention there is provided a method, system and computer readable medium capable of performing attempts for decoding including a first attempt without a list, i.e. with a list size of 1. This is intended to minimize the average decoding latency.

According to an embodiment of the invention there is provided a method, system and computer readable medium capable of setting a timer to limit the maximal decode latency of the decoder attempts. As long as the timer does not expire, the decoder keeps on attempting to decode the input with a gradually increasing list size Iterative soft decoding includes the process of performing soft decoding on some of the code components, and applying the most likely corrections (under different conditions, as will be elaborated here). On some code components it may be desired to perform only hard decoding. An example for such code can be a 3D code where the outer components are BCH codes which correct t>4 errors. If this code has inner-1 and inner-2 BCH components with decoding capability of t≤4, then soft decoding may be efficiently implemented here (in terms of computational complexity, and hardware implementation).

Soft Decoding of a Single Component Code

Soft decoding of a single component code may include calculating, for each single code component and for each dimension of the multi-dimensional codes, multiple first candidates, for example by applying, the following main steps. These first candidates are referred to as hypotheses in the next paragraphs. These first candidates differ from each other by locations of bits that are flipped (corrected).

In this section index i is used to denote a combination of component code and dimension of the multi-dimensional coding.

The soft decoding of a single components code may include:

S1: Sort code component indices from the least reliable to the $N^{th}$ least reliable bit. The least reliable bits may be those having lowest $|LLR(b_i)|$, i.e. lower absolute value LLR.

S2: Choose error bits' hypotheses according to minimal sum LLR from within the sorted indices.

S3: For every hypothesis, perform hard decoding.

S4: For every hypothesis with a valid hard decoding solution (i.e. misscorrection=0), compute $$\text{score} = \sum_{i \in Hyp} |LLR(b_i)| \quad (4)$$

Where Hyp corresponds to the group of inverted bits and the hard decoding solution indices. These together suggest a decoding hypothesis (first candidate).

S5: Save the solution with the lowest score as the most likely (first) candidate, and save also the second best hypothesis, with the second lowest score.

For efficiently decoding a BCH component code a decoding engine may include a syndrome update module, which is performed according to the error hypothesis, then for codes with t≤4 the error locating polynomial (ELP) may be efficiently generated, and the ELP may also be efficiently solved [C. Chen, "Formulas for the Solutions of Quadratic Equations over GF(2m)", IEEE Trans. On Information Theory, vol. 28, no. 5, 1982].

S6: In case the decoding is successful (i.e. missCorrection=0) for a certain hypothesis, the sum-LLR, as in (4), is computed, and a decision on whether or not to apply the correction can be made by the decoder. Conditions for applying the soft suggested corrections are disclosed here.

The process described above may be done over a set of predefined hypotheses (set of first candidates), and usually the hypothesis with the lowest score is considered as the most likely valid correction. This correction will be implemented in case it complies with several conditions as will be described next.

In cases where many errors exist, the nearest valid codeword in the sense of minimal score as computed in (4) may be a false correction.

In order to reduce probability of accepting false corrections, an iterative decoding process may be used, where after each dimension decoding, only a subset of suggested correction hypotheses are accepted. The subset is determined by the more likely hypotheses, e.g. those with a minimal score as computed in (4), out of all component codes that were processed in the current dimension. These selected corrections are implemented, and then soft decoding on the other dimension is done, by repeating the same steps described above.

In order have a meaningful impact of every accepted correction during the per component decoding, the decoder may use a mechanism of LLR clipping, which changes to values of the LLRs within the corrected component code to a maximal value, such that the soft decoder of other components is not likely to change any of the bits which belong to an already corrected component code.

To minimize the effect of accepting false corrections within the iterative decoding process, it is suggested to follow the disclosed methods via the list decoding.

Figure 2:
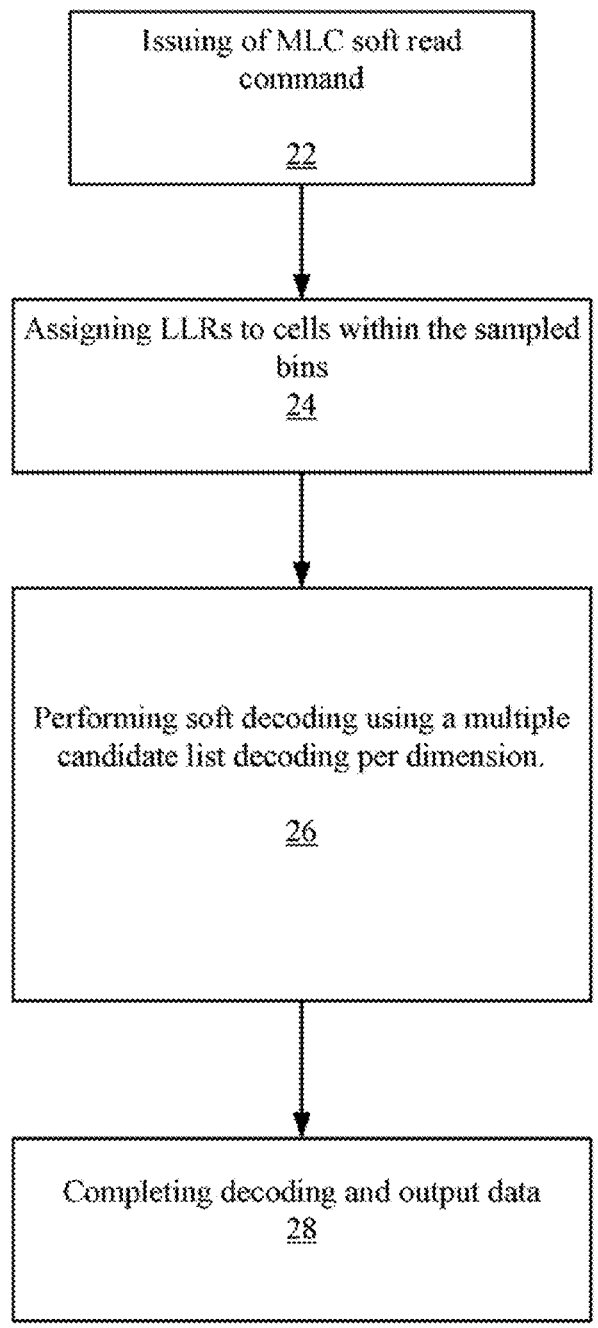
FIG. 2 illustrates a method according to an embodiment of the invention.

According to an embodiment of this invention, a soft decoding flow may include soft list decoding, as illustrated in FIG. 2. A flash controller issues (stage 22) a soft read command which requires sampling at multiple thresholds, as exemplified in FIG. 1. The DSP assigns reliability values per cell following the soft read process (stage 24). Then a soft decoding using a multiple candidate list decoding per dimension can be executed (stage 26) until it is completed (stage 28). During the soft decoding a list of candidates can be used. The list may be updated following every dimension decoding. The stop condition of the iterative decoding is either a maximal number of iterations reached, or a decoding success, which can be indicated by a cycling redundancy check (CRC), and by syndromes of decoded component codes, or any combination of these indicators.

Soft List Decoding Flow (Limiting the Number of Candidates)

Figure 3:
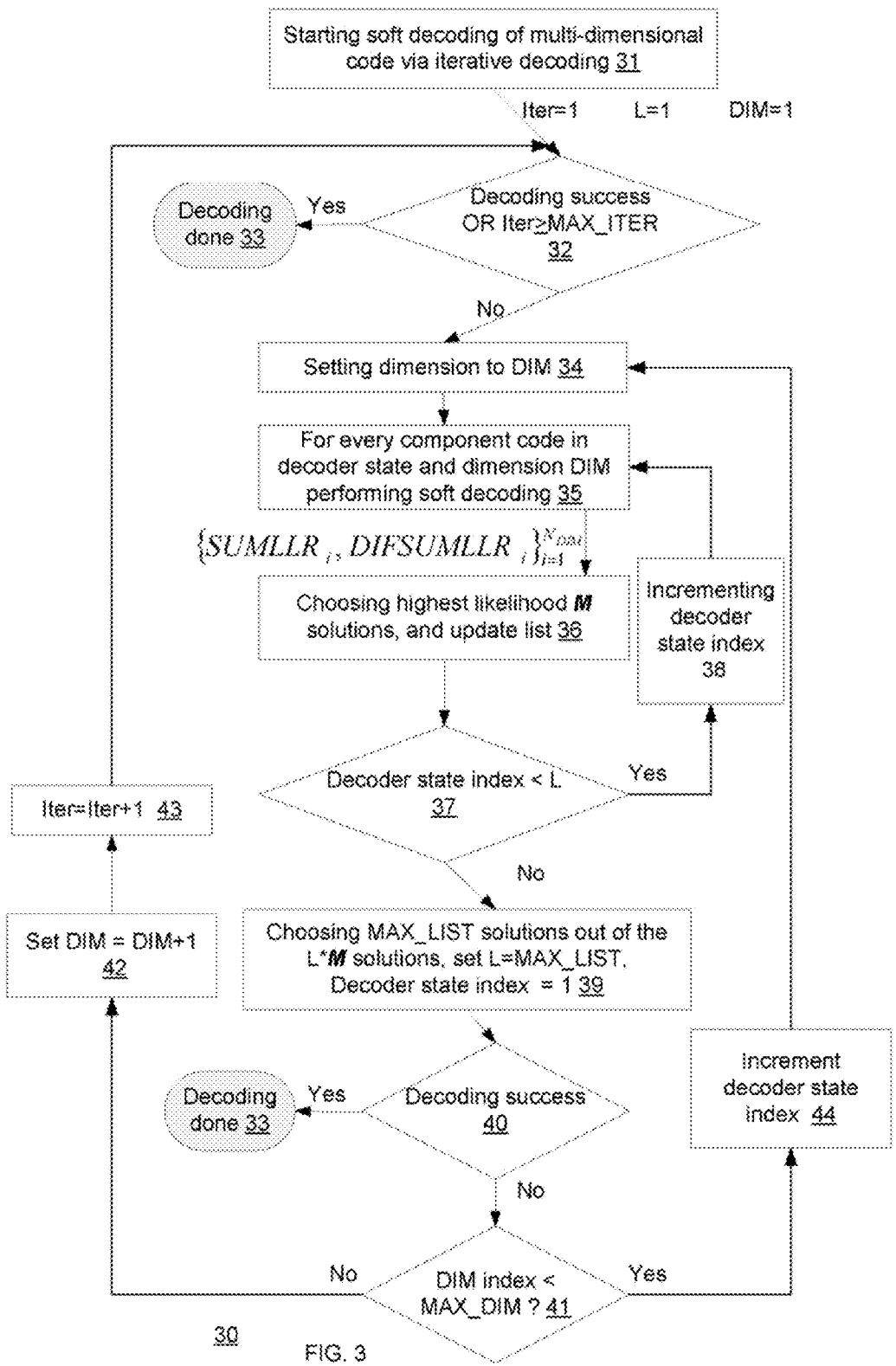
FIG. 3 illustrates a method according to an embodiment of the invention.

According to another embodiment of the invention, soft decoding uses list decoding as demonstrated in FIG. 3.

In this section different values of index i represent different first candidates. The method (30) starts (stage 31) by setting control variables (Iter=1, L=1, DIM=1) and then checking if the decoding should end (stage 32) if not—stage 32 is followed by of setting a dimension to DIM (stage 34).

The soft decoding with the list may include may include the following steps:

Step 1—Perform a dimension soft decoding—for a given dimension (stage 35) perform soft decoding of every component code that is currently not solved. The soft decoding of a single component code (generation of first candidates per each dimension and per each code component) was described earlier.

For every component code the soft decoder may generates two outputs:

A set of indices corresponding to the hypothesis with a smallest sum-LLR score (4). This hypothesis can be regarded as a second candidate.

Another set of indices corresponding to the second smallest sum-LLR score (4) hypothesis. This hypothesis can be regarded as a second most reliable first candidate.

These two outputs (second candidate and second most reliable first candidate per dimension and per code component) are obtained during the enumeration of the soft decoder over error candidates. These two outputs per component code are denoted in FIG. 3 by $SUMLLR_i$ and $DIFSUMLLR_i$, respectively.

Step 2—Create (stage 36) a list (of third candidates) by selecting various combinations of solutions (various combinations of second candidates). The number of combinations may be limited according to some parameter M. There are several methods for selecting the M solutions (M third candidates). For example, determine the set of solutions that has smallest $SUMLLR_i$ and highest $DIFSUMLLR_i$. From this group assume there are false corrections. Since it cannot be determined which is the false correction, the list is created from the different hypotheses of false correction, which reject different solutions of the selected set of solutions.

This process of dimension soft decoding and list generation from various combinations of potential solutions is repeated for every list state index (stages 37 and 38 control the number of iterations). The total number of list states is L. Every dimension decoding generates another M candidate list states. After completing L dimension decoding processes, there may be up to M·L candidate solutions.

Step 3—In order to limit the decoding complexity, the list size (of third candidates) is reduced back to L states by selecting L candidates (fourth candidates) out of the M·L candidates (stage 39). There are various methods for selecting L candidates, some of which are described as embodiments of this invention later on.

If the decoding is not yet successful for any of the L candidates, and the number of iterations did not exceed a maximal value (MAX_ITER), the process described above is done over all dimensions sequentially (stages 41-44 scan the dimensions and within each dimension scan the state indexes), and then repeated over and over until decoding succeeds or the number of iterations exceeds MAX_ITERS (stage 32).

According to an embodiment of the invention, the accepted solutions of every dimension decoding which construct the list state can modify the LLR values. Firstly, the LLR sign of error indices is flipped—this implements the hard value errors correction. Secondly, the absolute LLR values (LLR amplitude) may be modified for all bits associated with the corrected component codes. A possible modification for all bits is to assign a HIGH_LLR absolute value to all bits, while keeping their sign unchanged. This "clipping" operation keeps the hard decision value unchanged while changing the reliability metric of the bits to be high, indicating that the hard decision is correct at high probability, and thus assisting in the probability of achieving a successful decoding on the other dimension, as the component codes on each dimension are interleaved.

Criteria for Accepting Solutions of Soft Dimension Decoding

According to an embodiment of the invention, the set of solutions that are selected from second candidates calculated by a soft dimension decoding is determined by one of the following methods.

First option: Select all the second candidates that fulfill the following:

$$G_{ind} = \{G_i \in G_{ind} | SUMLLR_i \leq TH_1, DIFSUMLLR_i \geq TH_2\}_{i=1}^{NDIM} \quad (5)$$

Where $G_i$ is the group of indices corresponding to a solution of the i-th component code on dimension DIM. Then, $G_{ind}$ is the group of all solutions for which their sum-LLR is smaller than a first threshold $TH_1$, and where the DIFSUM-LLR of the component codes is greater than a second threshold $TH_2$, and where $$DIFSUMLLR_i \equiv SUMLLR_i^{(2)} - SUMLLR_i, \quad (6)$$

where $SUMLLR_i^{(2)}$ represents the score of the second best candidate solution of the i-th component code during its soft decoding.

Second option: Select the second candidates that fulfill the following:

$$G_{ind} = \{G_i \in G_{ind} | SUMLLR_i - DIFSUMLLR_i \leq TH_3\}_{i=1}^{NDIM} \quad (7)$$

Where $G_i$ is the group of indices corresponding to a solution of the i-th component code on dimension DIM. Then, $G_{ind}$ is the group of all solutions for which their difference of sum-LLR and DIFSUMLLR is smaller than a predefined thresholds $TH_3$.

Third Option:

Select the second candidates that fulfill either (5) or (7). If the number of solutions in the group is smaller than $N_{SOL}$. That is, $\|G_{ind}\| < N_{SOL}$, then adapt the thresholds $TH_1$, $TH_2$ or $TH_3$, such that at least $N_{SOL}$ solutions will be included in the group $G_{ind}$. This is required in order to guarantee a minimal innovation step of every dimension, while using the list in the next step to minimize the probability of applying a false correction.

Fourth Option:

Select second candidates that form group of at least $N_{ind}$ solution sets, by first sorting the score values, and taking the $N_{ind}$ solution with the smallest score, where the score can be computed according to $$\sum_{i \in Hyp} |LLR(b_i)| \text{ or } SUMLLR_i - DIFSUMLLR_i.$$

Forming a List from a Set of Accepted Solutions

According to another embodiment of the invention, there are several ways to create a list, of e.g. M candidates, from the result of a dimension soft decoding. Following the steps described above the decoder recommends $\|G_{ind}\|$ valid solutions. Since there is a non-zero probability for a false correction within every suggested solution in $G_{ind}$, the list can be created by taking the recommended solutions in $G_{ind}$, and First Option:

creating a set of $\|G_{ind}\|$ third candidates (out of the second candidates) where every candidate includes $\|G_{ind}\|-1$ solutions, such that a single solution from $G_{ind}$ is omitted. For every candidate another solution is omitted. The purpose of reducing the set of accepted solutions by a single solution, and every time a different solution, is to minimize the probability of accepting a false correction as a valid solution.

Second Option:

creating a set of $\|G_{ind}\| \cdot (\|G_{ind}\|-1)/2$ third candidates (out of the second candidates) where every candidate includes $\|G_{ind}\|-2$ solutions, such that two solutions are omitted from $G_{ind}$. For every candidate another pair of solutions is omitted.

The purpose of reducing the set of accepted solutions is again to minimize the probability of accepting a false correction as a valid solution.

Further options, naturally, exist where possibly more solutions are omitted, and all remaining solutions form a decoder state for the list.

According to an embodiment of the invention, a list can be formed from omitting solutions from $G_{ind}$ according to the options described above or any combination of these options.

Limiting the List Size Per Soft Dimension Decoding

According to another embodiment of the invention, there may be several ways to reduce the list size from M·L third candidates which are generated after performing at most L dimension decoding—and selecting L fourth candidates.

First option: For each list of third candidate (out of at most M·L candidates) compute the average cumulative score of a suggested set of solutions, that is $$S_{cand} = \frac{1}{\|G_{ind}\|} \sum_{i \in G_{ind}} |SUMLLR_i - DIFSUMLLR_i| \quad (8)$$

Where $\|G_{ind}\|$ is the solutions' group size for some candidate, and $G_{ind}$ is the group of indices associated with the accepted set of solutions, like specified for example in (5) or (7). The score $S_{cand}$ is computed for each set of solutions. Following this procedure there are up to M·L scores $S_{cand}$ and the list may be reduced to L states by keeping only the L candidates (not fourth candidates) with the smallest $S_{cand}$ score.

Second Option:

For each list of third candidate (out of at most M·L candidates) compute the average cumulative score of a suggested set of solutions, that is $$S_{cand} = \frac{1}{\|G_{ind}\|} \sum_{i \in G_{ind}} |SUMLLR_i| \quad (9)$$

Where $\|G_{ind}\|$ is the solutions' group size for some candidate, and $G_{ind}$ is the group of indices associated with the accepted set of solutions, like specified for example in (5) or (7). The score $S_{cand}$ is computed for each set of solutions. Following this procedure there are up to M·L scores $S_{cand}$ and the list may be reduced to L states by keeping only the L candidates with the smallest $S_{cand}$ score.

Third Option:

For each list of third candidates (out of at most M·L candidates) compute the average cumulative score of a suggested set of solutions and the solutions already implemented in previous iterations, that is $$S_{cand} = \frac{1}{\|G_{ind}\|} \sum_{i \in G_{ind}} |SUMLLR_i - DIFSUMLLR_i| + \frac{1}{\|G_{prev}\|} \sum_{i \in G_{prev}} |SUMLLR_i - DIFSUMLLR_i| \quad (10)$$

Where $\|G_{ind}\|$ is the solutions' group size for some candidate, and $G_{ind}$ is the group of indices associated with the accepted set of solutions, like specified for example in (5) or (7). The group $G_{prev}$ is associated with the group of solved packets on previous iteration and possibly other dimensions.

The intersection between $G_{ind}$ and $G_{prev}$ is i empty, i.e. $G_{prev} \cap G_{ind} = \phi$, since $G_{ind}$ includes recently solved results, while $G_{prev}$ is the accumulation of solutions that were obtained prior to current dimension decoding. The score $S_{cand}$ is computed for each set of solutions. Following this procedure there are up to M·L scores $S_{cand}$ and the list may be reduced to L states by keeping only the L candidates with the smallest $S_{cand}$ score.

Fourth Option:

For each list of third candidates (out of at most M·L candidates) compute the average cumulative score of a suggested set of solutions and the solutions already implemented in previous iterations, that is $$S_{cand} = \frac{1}{\|G_{ind}\|} \sum_{i \in G_{ind}} |SUMLLR_i| + \frac{1}{\|G_{prev}\|} \sum_{i \in G_{prev}} |SUMLLR_i| \quad (11)$$

Where $\|G_{ind}\|$ is the solutions' group size for some candidate, and $G_{ind}$ is the group of indices associated with the accepted set of solutions, like specified for example in (5) or (7). The group $G_{prev}$ is associated with the group of solved packets on previous iteration and possibly other dimensions. The intersection between $G_{ind}$ and $G_{prev}$ is i empty, i.e. $G_{prev} \cap G_{ind} = \phi$, since $G_{ind}$ includes recently solved results, while $G_{prev}$ is the accumulation of solutions that were obtained prior to current dimension decoding. The score $S_{cand}$ is computed for each set of solutions. Following this procedure there are up to M·L scores $S_{cand}$ and the list may be reduced to L states by keeping only the L candidates with the smallest $S_{cand}$ score.

According to an embodiment of the invention list is reduced from up to M·L decoder states into L decoder states by using one of the methods suggested above by computing scores $S_{cand}$ for each decoder state, and ranking these states according to the score value. In general, the score can be computed by either one of (8)-(11) or any combination of these scores.

Figure 4:
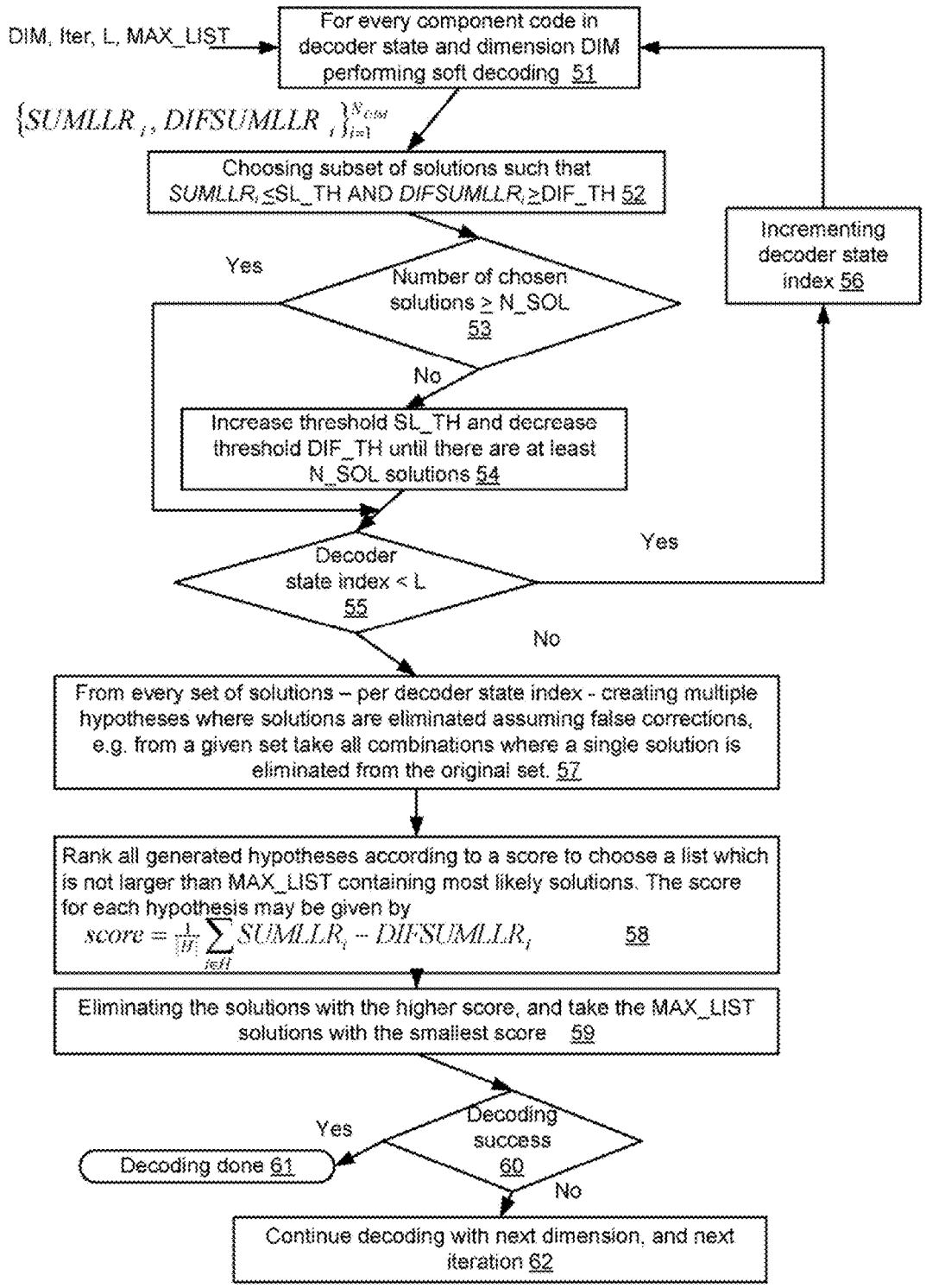
FIG. 4 illustrates a method according to an embodiment of the invention.

FIG. 4 exemplifies a list update flow, starting from the dimension soft decoding operation including the selection of candidate solutions and update of the L decoder states at the end. The flow operates on all initial L decoder states. A decoder state index is associated with a list entry which includes a state associated with all selected corrections and LLR updates obtained from previous dimensions/iterations processing.

The input for the process is the current dimension DIM, the current iteration Iter, number of members in current list L, and the maximal list size MAX_LIST. As a first step (stage 51) the decoder performs soft decoding on the first member of the list, which describes a decoder state. The decoding includes performing a soft decoding per component code in the current dimension DIM, which generates for every component code a score for the suggest solution if found, namely $\{SUMLLR_i, DIFSUMLLR_i\}_{i=1}^{N_{DIM}}$ where $N_{DIM}$ is the number of component codes in DIM. The accepted solutions are chosen (stage 52) to meet two conditions on these scores, and if there are less than N_SOL solutions (evaluated by stage 53) meeting these conditions, then the thresholds are adapted (stage 54) such that at least N_SOL solutions will be accepted. This is similar to the third option presented above for selecting the valid solutions, and using (5) as the score metric.

This process is repeated for every decoding state in the list, i.e. L times (control stages 55 and 56). Thus there are L potential decoding results (L fourth candidates), from which a list is to be formed.

Once all the L results are available, multiple hypotheses are generated for each of the decoding results (stage 57). The multiple hypotheses may be generates according to embodiments of the invention disclosed earlier, i.e. by taking various combinations of the accepted results aiming to avoid accepting false corrections. Then the method for maintaining a limited complexity for decoding is to reduce the number of accepted list entries. This may be done by ranking (stage 58) the multiple hypotheses of accepted solution, for example according to the score in (8) for every hypothesis. The scores are ordered, and only the MAX_LIST most likely corrections are saved (stage 59) into the updated list.

The decoding success (stage 60) is checked for every candidate/hypothesis/decoder state. If decoding is successful the decoding can terminate (stage 61) and output the decoder state associated with the success indication (e.g. CRC check was verified). If the decoding did not succeed yet on any of the hypotheses/list states then the decoding continues (stage 62) to next dimension/iteration with at most MAX_LIST list entries of the updated list.

Minimizing the Average Latency by Decoding Attempts with Different List Sizes

Figure 5:
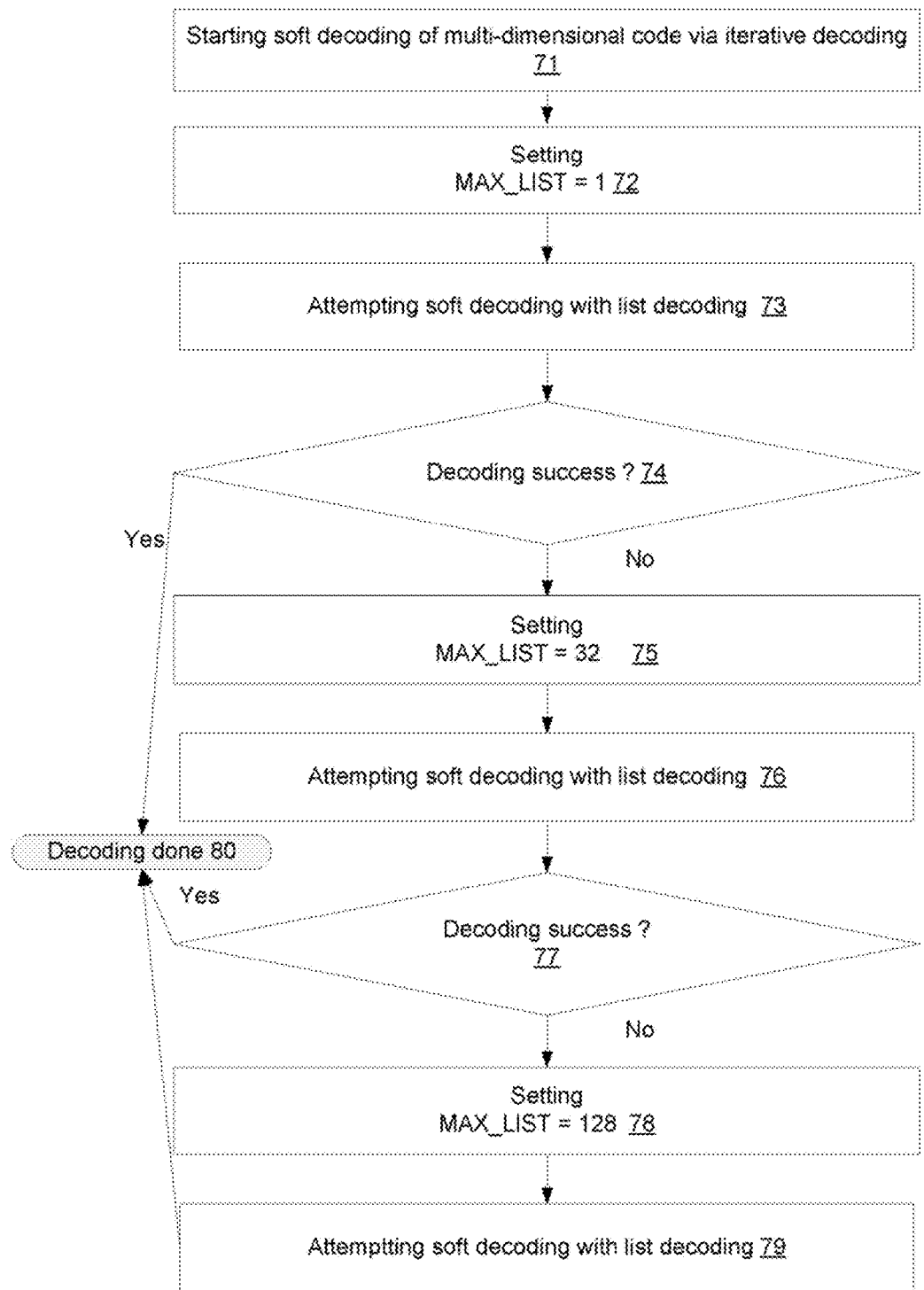
FIG. 5 illustrates a method according to an embodiment of the invention.

FIG. 5 exemplifies another embodiment of the invention, where the soft decoding latency is minimized by running the soft list decoding in a gradually increasing complexity, corresponding to a gradually increasing list size per decoding attempt. The first attempt starts by initial stage 71, setting MAX_LIST to one (stage 72) and performing soft decoding with a list of a single candidate (stage 73). Equivalently, this is a list of a single entry, i.e. MAX_LIST=1. If this decoding attempt succeeds, the decoding ends successfully (stage 80). Only if it fails, the decoder is re-activated (stage 75) with a list size configured to MAX_LIST=32. This means that decoding will follow the flows described earlier (stage 76), and update a 32-entries list every dimension decoding and iteration. If the decoding succeeds (stage 74 checks the success) here the process ends (stage 80), otherwise the decoder is configured (stage 78) to MAX_LIST=128, and the decoding starts over. This means that decoding will follow the flows described earlier (stage 79), and update a 128-entries list every dimension decoding and iteration. If decoding succeeds the process ends, otherwise the method may continue to another configuration or simply stops. It is noted that there may be two or more than three iterations with two or more than three sizes of lists and that the sizes of the list may differ from 1, 32 and 128.

As another embodiment of the invention, a timer may be used to limit the maximal latency of the decoder attempts. As long as the timer does not expire, the decoder keeps on attempting to decode the input with a gradually increasing list size, according to the embodiments of the invention.

List Decoding Performance

Figure 6:
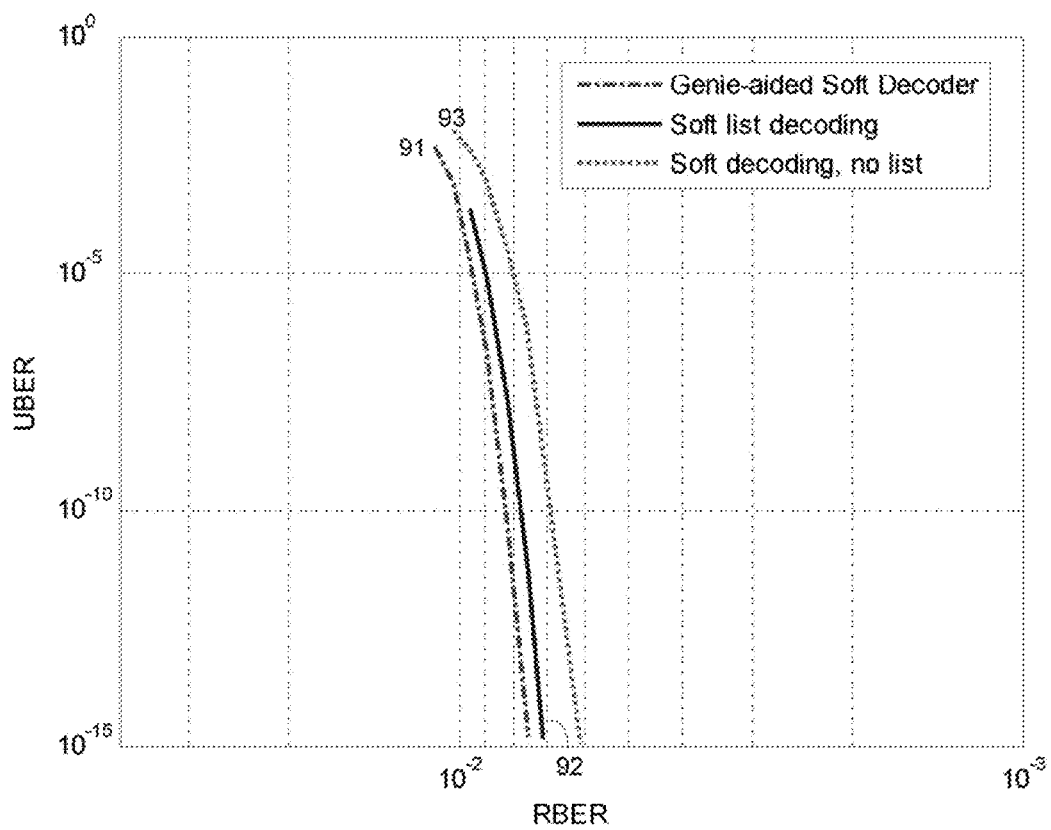
FIG. 6 illustrates the performance of a system according to an embodiment of the invention.

FIG. 6 exemplifies the decoder output uncorrected bit error rate (UBER) versus the input raw bit error rate (RBER). The first curve (91) is a genie aided soft decoder, where the genie-aided decoder is tightly linked to the actual soft decoder, by implementing the same soft decoding algorithm. The genie simply rejects false corrections, and accepts valid solutions when available during soft decoding of component codes. Therefore, the genie serves as an outer bound on the achievable reliability. It may be noticed from the other two curves (92—soft list decoding and 93—soft decoding without number limitations) that when using the soft list decoding it is possible to approximate the bound, while decoding without a list (MAX_LIST=1) degrades the achievable performance w.r.t. the bound.

LLR Clipping

In order to increase the convergence rate of the soft decoder with increasing LLR thresholds, it may be advisable to use a set of fast increasing thresholds for LLR_TH. This allows reducing the average number of iterations for soft decoding, which is efficient in terms of power consumption for hardware implementation.

According to an embodiment of this invention, the score thresholds, e.g. $TH_1/TH_2/TH_3$ in (5) and (7), may be dynamically adapted, and set according to the sum-LLR and difference sum-LLRs of the more likely corrections. That is, after every dimension decoding set the thresholds may be set such that there will be at least $N_{min}$ solutions accepted, and all valid solutions will be the most likely $N_{min}$ solutions. The other solutions may be considered as false corrections, and can be rejected. In this way the iterative decoding may have a high probability of successful and efficient convergence.

According to another embodiment of the invention, the decoder may perform LLR clipping after accepting a solution for a single soft decoded component code. The meaning of LLR clipping is the assignment of a different absolute value to all LLRs, regardless of their original absolute value, without changing the LLR sign. The absolute value can change to some maximal LLR value, which designates high confidence in the hard decision of the bits associated with a component code. The LLR clipping operation may be formally described by $$LLR_c(b_i)=sign(LLR(b_i)) \cdot MAX\_LLR(sol) \quad (12)$$

Where $LLR(b_i)$ is the original LLR value, and MAX_LLR (sol) is the clipping value, associated with the solution score sol. For example, there may be a mapping function which maps a solution score to a clipping value MAX_LLR(sol), where the score can be computed according to $SUMLLR_i$ and $DIFSUMLLR_i$, as in (6).

LLR Clipping Reset During Iterative Decoding

According to another embodiment of the invention, the LLR clipping may be reset during the iterative decoding, such that false corrections, which were wrongly clipped, corrected again. This may be useful when decoder does not converge as expected after several iterations. It is not recommended to restart decoding, since it may unnecessarily increase the decoding latency. Thus, resetting the LLR values of the whole codeword may be useful, that is $$LLR_R(b_i)=sign(LLR_M(b_i)) \cdot LLR_O(b_i) \quad (13)$$

Where $LLR_M(b_i)$ is the current LLR value of $b_i$, $LLR_O(b_i)$ is the original LLR value of $b_i$, $LLR_R(b_i)$ is the LLR value of $b_i$ after the reset operation of the LLRs Is specified in (13).

Figure 7:
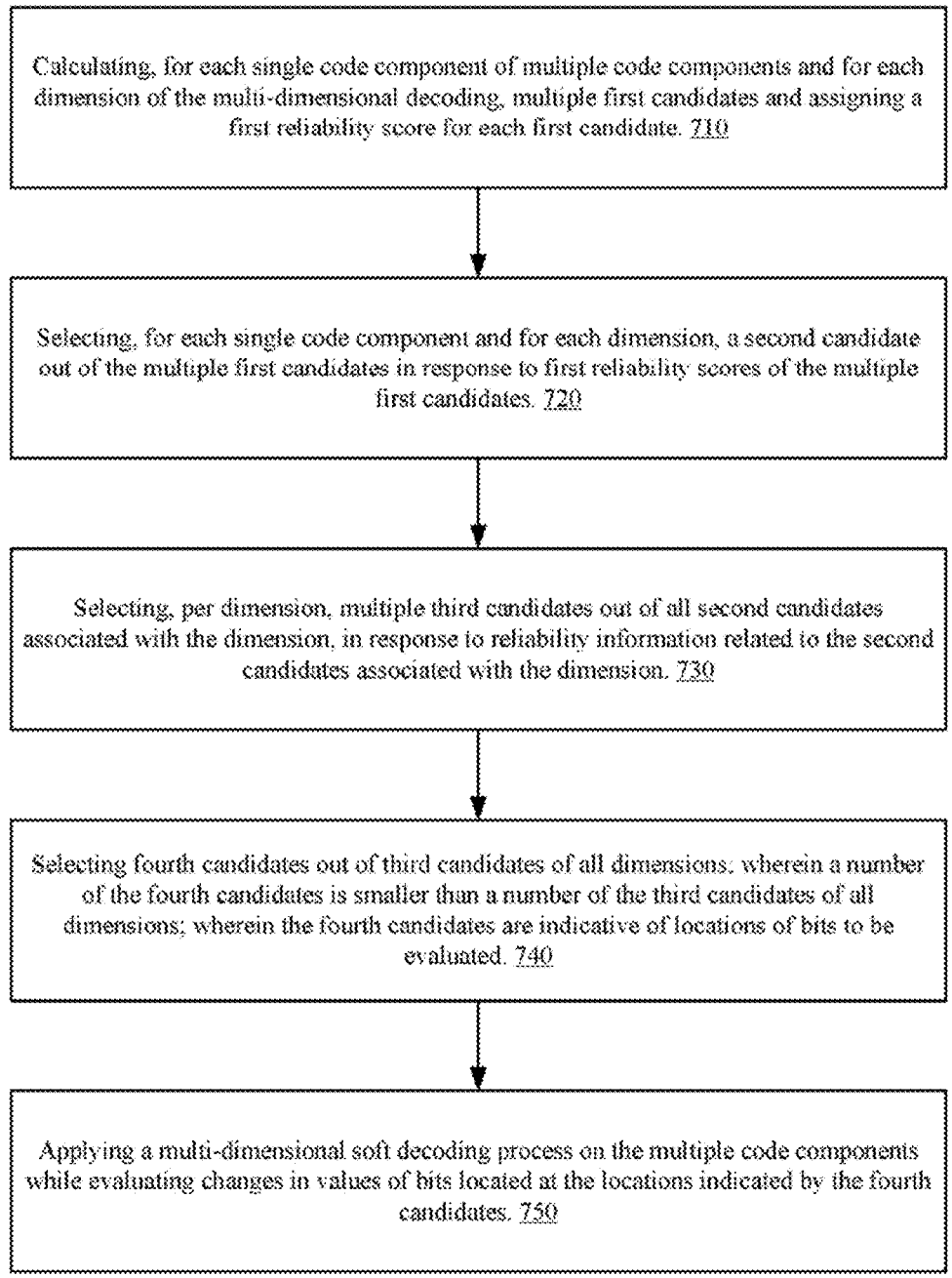
FIG. 7 illustrates a method according to an embodiment of the invention.
Figure 8:
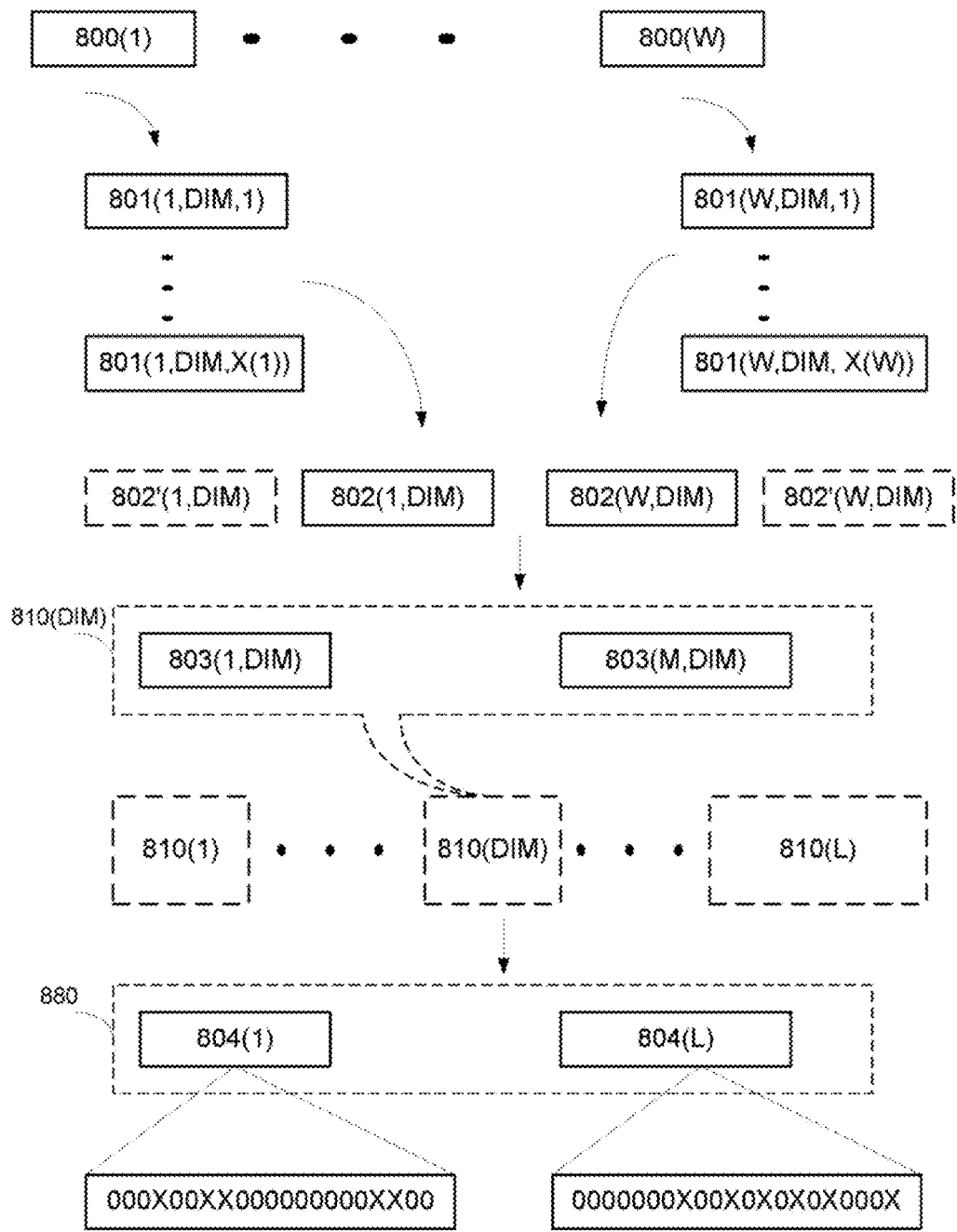
FIG. 8 illustrates code components and various candidates according to an embodiment of the invention.

FIG. 7 illustrates method 700 according to an embodiment of the invention. FIG. 8 illustrates code components 800(1)-800(W) and various candidates according to an embodiment of the invention.

Method 700 may start by stage 710 of calculating, for each single code component of multiple code components and for each dimension of the multi-dimensional decoding, multiple first candidates and assigning a first reliability score for each first candidate. Referring to the example set forth in FIG. 8—for a certain dimension (DIM), multiple (X(1)) first candidates 801(1,DIM,1)-801(1,DIM,X(1)) are calculated per code component 800(W) and multiple (X(W)) first candidates 801(W,DIM,1)-801(W,DIM,X(1)) are calculated per code component 800(W). The number of first candidates per code component (for example X(1) and X(W)) can equal to each other or may differ from each other.

Stage 710 may include selecting each second candidate as a most reliable first candidate out of the multiple first candidates. Referring to the example set forth in FIG. 8, the second candidates of 800(1) and 800(W) are referred to as 802(1, DIM) and 802(W,DIM) respectively. FIG. 8 also shows that the method stores the reliability score of the second best first candidates—802'(1,DIM) and 802'(W,DIM) respectively.

Stage 710 may include selecting each second candidate as a most reliable first candidate out of the multiple first candidates.

Stage 710 may be followed by stage 720 of selecting, for each single code component and for each dimension, a second candidate out of the multiple first candidates in response to first reliability scores of the multiple first candidates.

Stage 720 may be followed by stage 730 of selecting, per dimension, multiple third candidates out of all second candidates associated with the dimension, in response to reliability information related to the second candidates associated with the dimension.

Referring to the example set forth in FIG. 8, there are M third candidates (collectively denoted 810(DIM)) for each dimension (DIM). These third candidates are denoted 803(1, DIM)-803(M, DIM). Overall there may be L*M candidates-L groups of M third candidates per dimension —810(1)-810 (L). For simplicity of explanation it is assumed that DIM is between 1 and L and thus FIG. 8 also shows 810(DIM).

Stage 730 may include selecting the multiple third candidates in response to the reliability information related to the second candidates associated with the dimension and in response to third candidates number constraint.

Stage 730 may include selecting the multiple third candidates in response to reliability information related to second candidates associated with the dimension and to second most reliable first candidates.

Stage 730 may include selecting the multiple third candidates in response to a difference between reliability levels of second candidates and reliability levels of second most reliable first candidates that are associated with the second candidates.

Stage 730 may be followed by stage 740 of selecting fourth candidates out of third candidates of all dimensions; wherein a number of the fourth candidates is smaller than a number of the third candidates of all dimensions; wherein the fourth candidates are indicative of locations of bits to be evaluated.

Referring to the example set forth in FIG. 8, there are L forth candidates (collectively denoted 880). These fourth candidates are denoted 804(1)-804(L). FIG. 8 also shows that each forth candidate is indicative of the location of bits that should be evaluated (denoted "X") and bits that should remain unchanged during the encoding (denoted "0").

Stage 740 may include evaluating multiple combinations of third candidates and rejecting at least one combination of third candidates.

Stage 740 may include evaluating a combination of third candidates of a certain dimension by initializing a next dimension encoding by a certain dimension state obtained by applying the combination of the third candidates of the certain dimension.

Stage 740 may include selecting the fourth candidates in response to reliability scores of the third candidates.

Stage 740 may include selecting the fourth candidates in response to reliability scores of the third candidates and in response to reliability scores of second candidates associated with the third candidates.

Stage 740 may include selecting the fourth candidates in response to reliability information related to the third candidates and in response to fourth candidate number limitation.

Stage 740 may be followed by stage 750 of applying a multi-dimensional soft decoding process on the multiple code components. Stage 750 may include evaluating changes in values of bits located at the locations indicated by the fourth candidates.

According to various embodiment of the invention the selection of each of the second, third and fourth candidates (stages 720, 730 and 740) may include altering reliability scores related to a selected candidate (second candidate during stage 720, third candidate during stage 730 and fourth candidate during stage 740), after selecting the selected candidate to reflect the selecting of the selected candidate. The altering may include changing a value of a reliability score without changing an absolute value of the reliability score without changing a sign of the reliability score. Alternatively, the altering may include changing a value of a reliability score by changing a sign of the reliability score.

Figure 9:
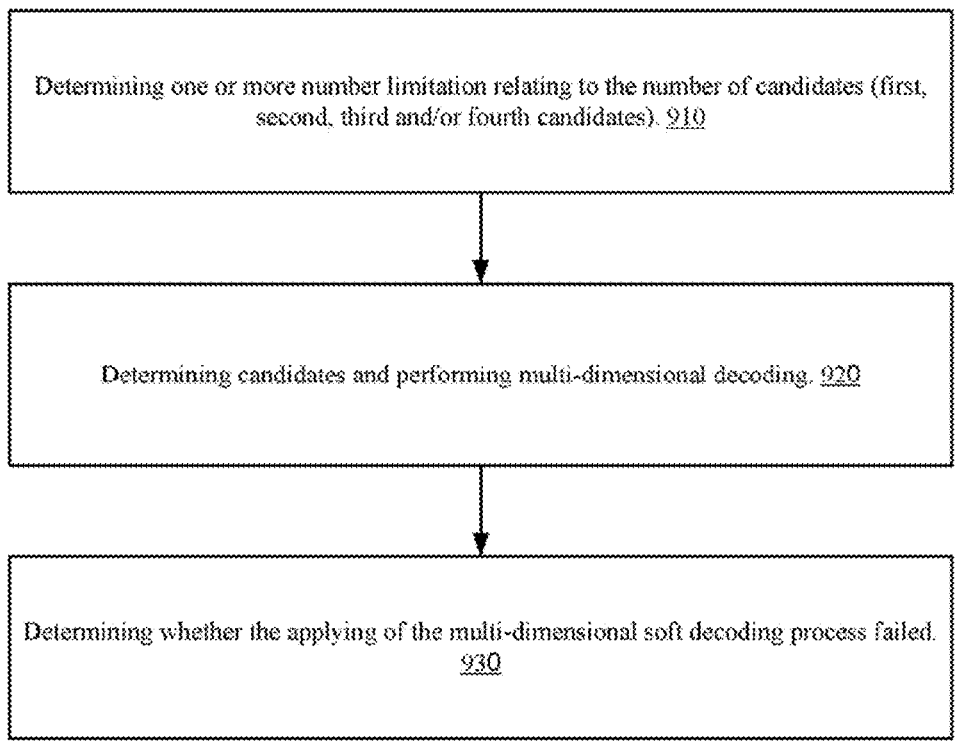
FIG. 9 illustrates a method according to an embodiment of the invention.

FIG. 9 illustrates method 900 according to an embodiment of the invention.

Method 900 may start by initialization stage 910 of determining one or more number limitation relating to the number of candidates (first, second, third and/or fourth candidates).

Stage 910 may be followed by stage 920 of determining candidates and performing multi-dimensional decoding. Stage 920 may include stages 710-740.

Stage 920 may be followed by stage 930 of determining whether the applying of the multi-dimensional soft decoding process failed. If it did not fail the method ends else—stage 930 may be followed by stage 910 during which at least one number limitation relating to the number of candidates is changed in relation to the numbers set in a previous iteration of stage 910.

Figure 10:
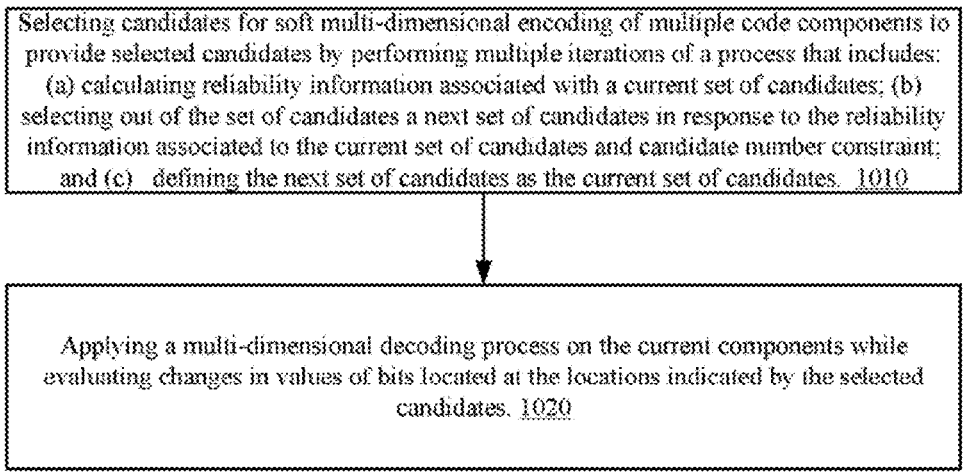
FIG. 10 illustrates a method according to an embodiment of the invention.

FIG. 10 illustrates method 1000 according to an embodiment of the invention.

Method 1000 may start by stage 1010 of selecting candidates for soft multi-dimensional encoding of multiple code components to provide selected candidates by performing multiple iterations of a process that includes: (a) calculating reliability information associated with a current set of candidates; (b) selecting out of the set of candidates a next set of candidates in response to the reliability information associated to the current set of candidates and candidate number constraint; and (c) defining the next set of candidates as the current set of candidates. Method 700 provides an example of a process that selects first, second, third and fourth candidates during four iterations.

Stage 1010 may be followed by stage 1020 of applying a multi-dimensional decoding process on the current components. Stage 1020 may include evaluating changes in values of bits located at the locations indicated by the selected candidates.

Stage 1010 may include any one of stages 710-740 of method 700.

Figure 11:
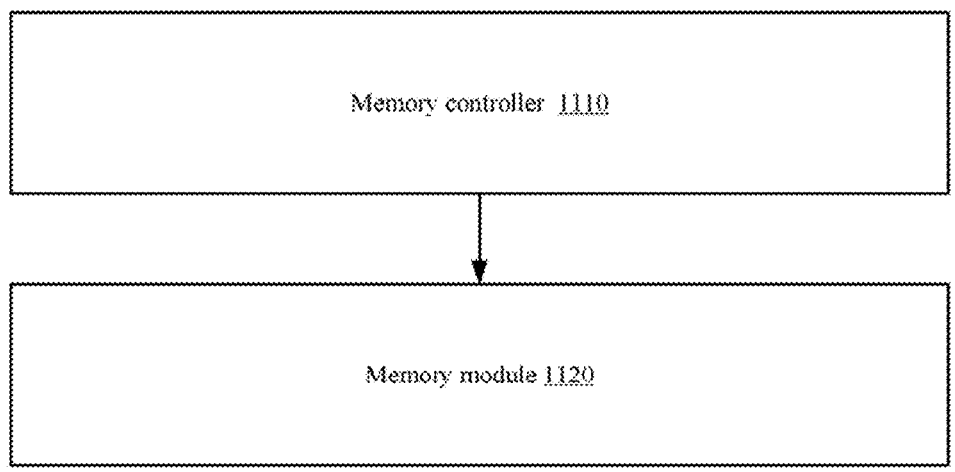
FIG. 11 illustrates a device according to an embodiment of the invention.

FIG. 11 illustrates a system 1100 according to an embodiment of the invention.

System 1100 includes memory module 1120 and memory controller 1110. The memory controller 1110 may execute any of the methods mentioned above.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for multi-dimensional decoding, the method comprises:
    calculating, for each single code component of multiple code components and for each dimension of the multi-dimensional decoding, multiple first candidates and assigning a first reliability score for each first candidate;
    selecting, for each single code component and for each dimension, a second candidate out of the multiple first candidates in response to first reliability scores of the multiple first candidates;
    selecting, per dimension, multiple third candidates out of all second candidates associated with the dimension, in response to reliability information related to the second candidates associated with the dimension;
    selecting fourth candidates out of third candidates of all dimensions; wherein a number of the fourth candidates is smaller than a number of the third candidates of all dimensions; wherein the fourth candidates are indicative of locations of bits to be evaluated; and
    applying a multi-dimensional soft decoding process on the multiple code components.

2. The method according to claim 1, comprising selecting each second candidate as a most reliable first candidate out of the multiple first candidates.

3. The method according to claim 1, wherein the selecting of the multiple third candidates is responsive to reliability information related to second candidates associated with the dimension and to second most reliable first candidates.

4. The method according to claim 3, wherein the selecting is responsive to a difference between reliability levels of most reliable and second most reliable second candidates and reliability levels of second most reliable first candidates that are associated with the second candidates.

5. The method according to claim 1, wherein the selecting of the fourth candidates comprises evaluating multiple combinations of third candidates and rejecting at least one combination of third candidates.

6. The method according to claim 5, comprising evaluating a combination of third candidates of a certain dimension by initializing a next dimension decoding by a certain decoder state obtained by applying the combination of the third candidates of the certain dimension.

7. The method according to claim 1, comprising selecting the multiple third candidates in response to the reliability information related to the second candidates associated with the dimension and in response to third candidates number constraint.

8. The method according to claim 1, comprising selecting the fourth candidates in response to reliability scores of the third candidates.

9. The method according to claim 1, comprising selecting the fourth candidates in response to reliability scores of the third candidates and in response to reliability scores of second candidates associated with the third candidates.

10. The method according to 1, comprising selecting the fourth candidates in response to reliability information related to the third candidates and in response to fourth candidate number limitation.

11. The method according to claim 1, comprising determining that the applying of the multi-dimensional soft decoding process failed; changing at least one number limitations related to at least one of the first, second, third and fourth candidates and repeating the stages of calculating multiple first candidates, selecting a second candidate for each single code component and for each dimension, selecting, per dimension, multiple third candidates, selecting fourth candidates and applying the multi-dimensional soft decoding process.

12. The method according to claim 1, comprising altering reliability scores related to a selected candidate out of the first, second, third and fourth candidates, after selecting the selected candidate to reflect the selecting of the selected candidate.

13. The method according to claim 12, wherein the altering comprises changing a value of reliability score by changing an absolute value of the reliability score without changing a sign of the reliability score.

14. The method according to claim 12, wherein the altering comprises changing a value of reliability score by changing a sign of the reliability score.

15. The method according to claim 12, comprising altering reliability scores related to the selected candidate in response to values of the reliability scores of the selected candidate prior to the altering.

16. The method according to claim 12, comprising resetting reliability scores related to the selected candidate.

17. The method according to claim 1 comprising rejecting candidates out of the first, second and third candidates by comparing the candidates to thresholds; wherein the method comprises altering the thresholds.

18. A method for multi-dimensional decoding, the method comprises:
selecting candidates for soft multi-dimensional decoding of multiple code components to provide selected candidates by performing multiple iterations of a process that comprises:
calculating reliability information associated with a current set of candidates;
selecting out of the set of candidates a next set of candidates in response to the reliability information associated to the current set of candidates and candidate number constraint candidate number constraint that defines a maximal number of candidates; and
defining the next set of candidates as the current set of candidates; and
applying a multi-dimensional decoding process on the current components.

19. The method according to claim 18, wherein the reliability information of at least one current set of candidates comprises most reliable previous set candidates and second most reliable previous set candidates.

20. The method according to claim 18, comprising evaluating changes in values of bits located at the locations indicated by the fourth candidates.

21. The method according to claim 18, wherein the performing of the multiple iterations of the process comprises executing at least two of the following stages:
selecting, for each single code component and for each dimension, a second candidate out of the multiple first candidates in response to first reliability scores of the multiple first candidates;
selecting, per dimension, multiple third candidates out of all second candidates associated with the dimension, in response to reliability information related to the second candidates associated with the dimension;
selecting fourth candidates out of third candidates of all dimensions; wherein a number of the fourth candidates is smaller than a number of the third candidates of all dimensions; wherein the fourth candidates are indicative of locations of bits to be evaluated;
and applying a multi-dimensional soft decoding process on the multiple code components.

22. A non-transitory computer readable medium that includes instructions to be executed by a computerized system and include instructions for: selecting candidates for soft multi-dimensional decoding of multiple code components to provide selected candidates by performing multiple iterations of a process that comprises: calculating reliability information associated with a current set of candidates; selecting out of the set of candidates a next set of candidates in response to the reliability information associated to the current set of candidates and candidate number constraint that defines a maximal number of candidates; and defining the next set of candidates as the current set of candidates; and applying a multi-dimensional decoding process on the current components.

* * * * *